United States Patent [19]
Ono

[11] Patent Number: 5,485,429
[45] Date of Patent: Jan. 16, 1996

[54] SEMICONDUCTOR MEMORY DEVICE WITH REFRESH TIMER CIRCUIT

[75] Inventor: Yoshitaka Ono, Kawasaki, Japan

[73] Assignee: Kabushiki Kaisha Toshiba, Kanagawa, Japan

[21] Appl. No.: 326,833

[22] Filed: Oct. 21, 1994

[30] Foreign Application Priority Data

Oct. 22, 1993 [JP] Japan .................................. 5-264420

[51] Int. Cl.$^6$ ................................................. G11C 11/403
[52] U.S. Cl. ........................ 365/222; 365/211; 365/194; 365/212
[58] Field of Search .................................. 365/222, 211, 365/212, 194

[56] References Cited

U.S. PATENT DOCUMENTS 5,321,661  6/1994  Iwakiri et al. ........................ 365/222
5,375,093  12/1994  Hirano ................................. 365/222

FOREIGN PATENT DOCUMENTS

2246088  10/1990  Japan ................................ 365/222

*Primary Examiner*—David C. Nelms
*Assistant Examiner*—Vu A. Le
*Attorney, Agent, or Firm*—Finnegan, Henderson, Farabow, Garrett & Dunner

[57] ABSTRACT

A semiconductor memory device has a dynamic memory element constructed of a capacitor and a transistor; and a refresh timer circuit for automatically recharging the dynamic memory element at periodic time intervals corresponding to an electric charge holding time of the dynamic memory element which changes in accordance with an ambient temperature. Since the refresh timer circuit includes a current bias circuit for varying an electric current in accordance with the ambient temperature and an oscillation circuit for oscillating at a frequency corresponding to the electric current of the current bias circuit, the refresh cycle time changes in response to ambient temperature changes, thus reducing the requisite current capacity of the memory device power supply.

2 Claims, 5 Drawing Sheets

SEMICONDUCTOR MEMORY DEVICE WITH REFRESH TIMER CIRCUIT

BACKGROUND OF THE INVENTION

The present invention relates to a semiconductor memory device including a dynamic memory element.

A memory operation of a dynamic memory element composed of one capacitor and one transistor is performed by, as known well, supplying the capacitor with electric charges and thus holding bit data in this state. The electric charges, i.e., the data, supplied to the capacitor are dissipated with a passage of time due to a leak current from insulating films constituting the transistor and the capacitor. For this reason, the semiconductor memory device including the dynamic memory element is so constructed that the capacitor is automatically recharged (refresh operation) at an interval of a fixed time by providing a refresh timer circuit. The dissipation of the data is thus prevented.

Figure 12:
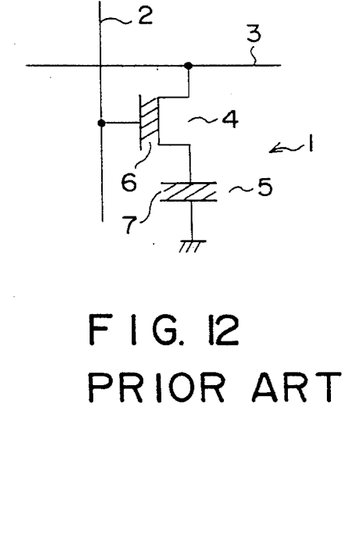
FIG. 12 is a circuit diagram illustrating a unit of a conventionally employed dynamic memory element.
Figure 13:
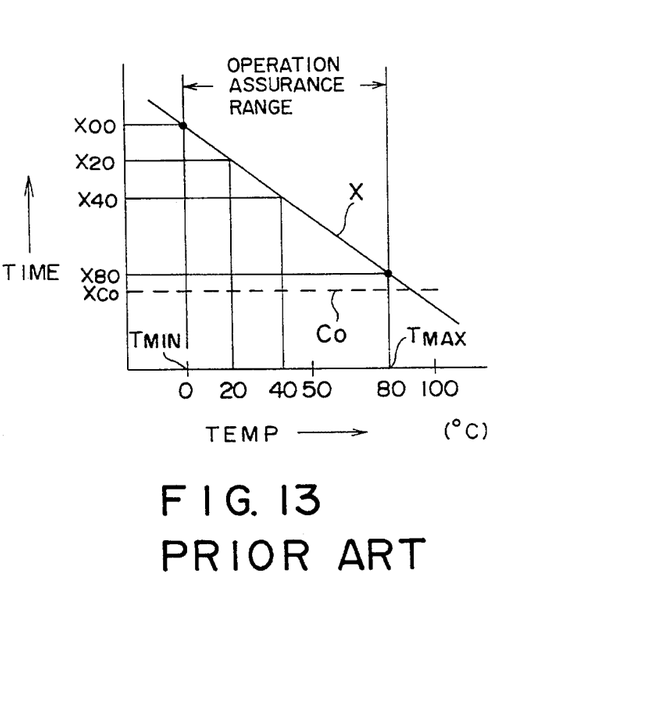
FIG. 13 is a characteristic diagram showing a temperature characteristic of an electric charge holding time of the conventional dynamic memory element versus a refresh cycle.

The prior art will hereinafter be described with reference to FIGS., 12 and 13. FIG. 12 is a circuit diagram illustrating a unit of the dynamic memory element. FIG. 13 is a characteristic diagram showing a temperature characteristic of an electric charge holding time of the conventional dynamic memory element versus a refresh cycle.

FIG. 12 illustrates a dynamic memory element 1 formed on a silicon semiconductor substrate. This dynamic memory element 1 comprises a transistor 4, having a gate connected to a switching line 2 and a source connected to a data line 3, for performing a switching operation. The dynamic memory element 1 also comprises a capacitor 5 connected between a drain of this transistor 4 and the ground. The numeral 6 designates a gate insulting film of the transistor 4, and the numeral 7 represents an electrode-to-electrode insulating film interposed between electrodes of the capacitor 5. Both of these insulating films are formed of silicon oxide ($SiO_2$).

A plurality of dynamic memory elements 1 are provided on a semiconductor substrate together with other unillustrated circuit elements and wiring, thus constituting a semiconductor memory device.

In such a dynamic memory element 1, the electric charges supplied to the capacitor 5 flow in the form of a leak current. Then, the leak current increases with a rise in temperature, and, therefore, it follows that an electric charge holding time X of the dynamic memory element 1, as indicated by the solid line in FIG. 13, changes to increase when at a low temperature but decrease when at a high temperature. From the above-mentioned, a refresh operation of the dynamic memory element 1 is carried out in a predetermined electric charge holding time and is assured within a predetermined temperature range.

On the other hand, the refresh timer circuit for performing the refresh operation of the dynamic memory element 1 via the data line 3 is typically constructed of a transistor, and the refresh cycle receives almost no influence by the temperature.

For this reason, a refresh cycle C0 of the thus constructed refresh timer circuit is set based on the shortest electric charge holding time with a maximum temperature value TMAX falling within the temperature range defined as an operation assurance range. More specifically, for example, if the operation assurance range is from 0° C. to 80° C., the refresh cycle C0 is set to a fixed time Xc0 shorter than an electric charge holding time X80 when the maximum temperature value TMAX=80° C. Note that the refresh cycle C0 is indicated by the solid line in FIG. 9, and there exists a difference on the order of substantially two digits between the electric charge holding time X80 when the maximum temperature value TMAX=80° C. and an electric charge holding time X00 when the minimum temperature value TMIN=0° C.

However, the operation of the semiconductor memory device having the above dynamic memory elements 1 and the refresh timer circuit is often effected within a range of, e.g., 20° C. through 40° C. that is a narrower temperature range than the operation assurance range, the electric charge holding time at the operation-often-conducted temperatures 20° C. through 40° C. is as long as X20 through X40. Nevertheless, it follows that the refresh operation is carried out with the initially-set short time Xc0 serving as the refresh cycle C0.

Performing such a refresh operation entails an increase in cumulative quantity of the electric current required for refreshing because of effecting the refreshing at a more increased frequency than needed. This therefore requires a refresh power supply having a large current capacity, and, when a battery is used, a large-sized battery having the large capacity has to be employed, or alternatively the battery has to be charged or replaced at an increased frequency. Note that when constructing the semiconductor memory device with the operating temperature range made narrower in conformity with individual operating conditions, the generalization of the semiconductor memory device for use is restricted.

As stated above, according to the prior art, the refresh operation of the dynamic memory element is assured in the temperature range broader than an actual operation range, and, hence, the large-capacity poser supply is needed. Besides, the semiconductor memory device involves the use of the battery as a power supply is brought into such a situation that the battery is replaced at the increased frequency.

SUMMARY OF THE INVENTION

It is an object of the present invention, which was devised under such circumstances, to provide a semiconductor memory device capable of decreasing a capacity of a power supply for a refresh operation and easily dealing with the power supply.

According to the present invention, there is provided a semiconductor memory device comprising:
  a dynamic memory element constructed of a capacitor and a transistor; and
  a refresh timer circuit for changing a refresh cycle with respect to said dynamic memory element, corresponding to an electric charge holding time of said dynamic memory element which changes in accordance with a temperature.

The refresh timer circuit preferably includes: a current bias circuit for changing an electric current in accordance with the temperature; and an oscillation circuit for oscillating a frequency corresponding to the electric current of said current bias circuit.

The current bias circuit preferably includes a resistance component exhibiting a temperature dependent characteristic in terms of a resistance value.

In the semiconductor memory device according to the present invention, a refresh cycle of a refresh timer circuit changes corresponding to a variation in electric charge holding time of a dynamic memory element in accordance with an ambient temperature. Accordingly, when the semiconductor memory device including the dynamic memory element performs a memory operation at a temperature within an operation assurance range thereof, the refresh cycle of the refresh timer circuit, corresponding to the electric charge holding time of the dynamic memory element at the temperature during this operation, changes to a cycle having a proper value but longer than the refresh cycle set short enough to satisfy the refresh operation at every temperature within the operation assurance range. For this reason, a replacement frequency of a battery-used power supply decreases, and consequently the power supply becomes easier to deal with.

BRIEF DESCRIPTION OF THE DRAWINGS

Other objects and advantages of the present invention will become apparent during the following discussion in conjunction with the accompanying drawings, in which.

DETAILED DESCRIPTION OF THE PREFERRED EMBODIMENTS

Embodiments of the present invention will hereinafter be discussed with reference to the drawings.

Figure 1:
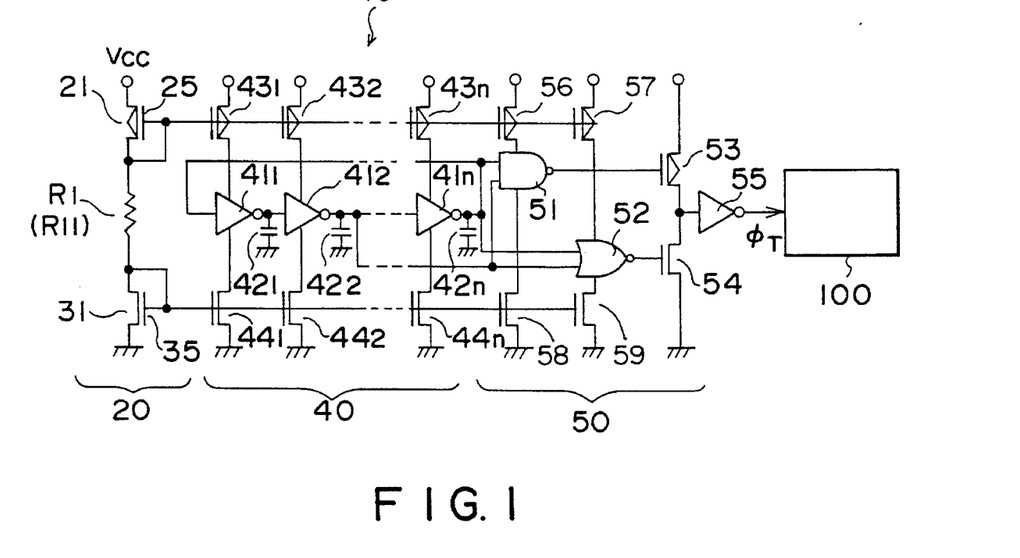
FIG. 1 is a circuit diagram illustrating a current mirror type refresh timer circuit in a first embodiment of the present invention.
Figure 2:
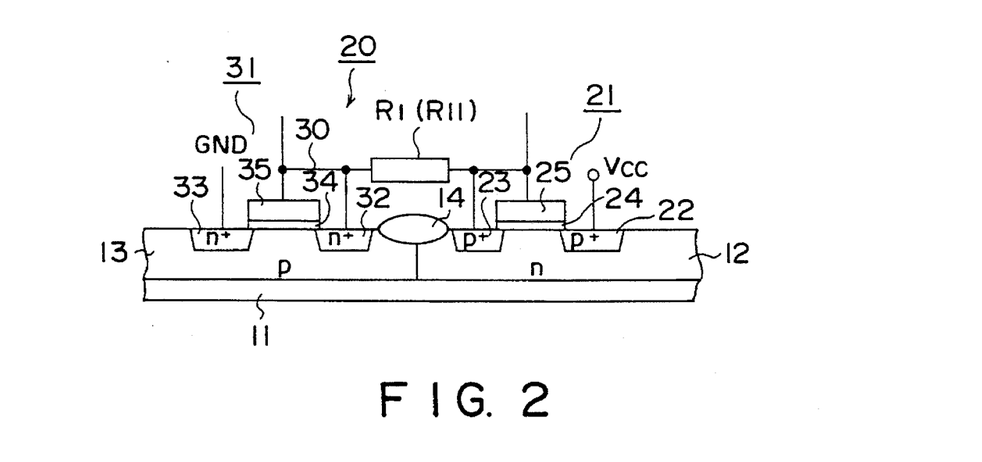
FIG. 2 is a schematic sectional view of the principal portion in the first embodiment of the present invention.
Figure 3:
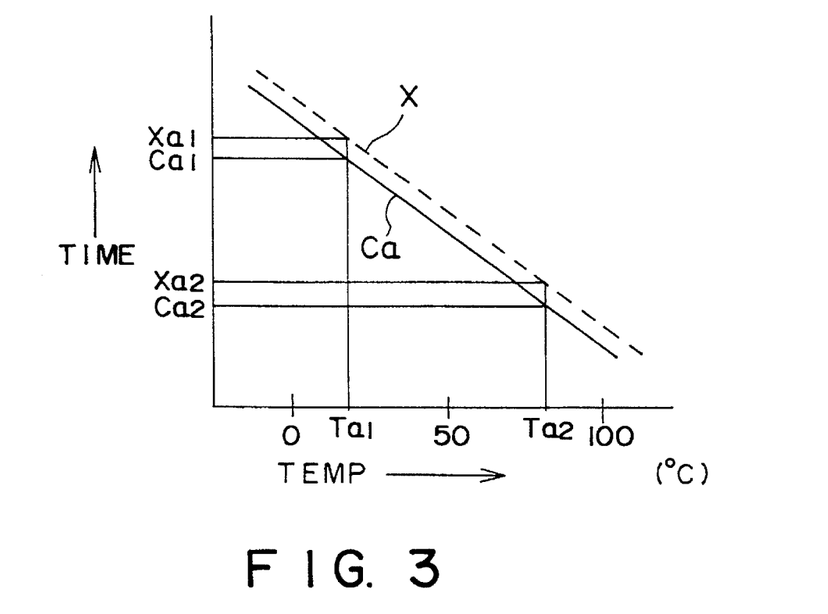
FIG. 3 is a characteristic diagram showing a temperature characteristic of a refresh cycle of the current mirror type refresh timer circuit versus an electric charge holding time of a dynamic memory element in the first embodiment of the present invention.

To start with, a first embodiment will be described with reference to FIGS. 1 through 3. FIG. 1 is a circuit diagram of a current mirror type refresh timer circuit 10. FIG. 2 is a schematic sectional view of the principal portion of a semiconductor memory device in which the circuit of FIG. 1 is actualized. FIG. 3 is a temperature characteristic diagram showing a refresh cycle of the current mirror type refresh timer circuit versus an electric charge holding time of a dynamic memory element.

Referring to FIG. 1, the current mirror type refresh timer circuit 10 defined as the principal portion of the present invention is constructed of a current bias circuit 20, a ring oscillator 40 and a buffer circuit 50. An output ΦT is supplied from the buffer circuit 50 via a data line to a memory cell array 100 inclusive of the dynamic memory element shown in FIG. 12.

The current bias circuit 20 is constructed in such a way that a self-biased p-channel MOS transistor 21, a resistance element R11 serving as a resistance component R1 and a self-biased n-channel MOS transistor 31 are connected in series between a power supply Vcc and the ground. The ring oscillator 40 is constructed such that n-stages of inverters $41_1$–$41_n$ are connected in series, and an output of the last stage is fedback to the first stage. Respective capacitors $42_1$–$42_n$ are provided between the output sides of the individual stages and the ground.

The buffer circuit 50 is constructed of a NAND circuit 51 inputting a last stage output of the ring oscillator 40 and a middle stage output of the same logic, a NOR circuit 52, a p-channel MOS transistor 53 which gate-inputs an output of the NAND circuit 51, an n-channel MOS transistor 54 connected in series to this p-channel MOS transistor 53 and gate-inputting an output of the NOR circuit 52, and an inverter 55 having an input point which is a connection mid-point between these two MOS transistors 53 and 54.

Each of the above inverters $41_1$–$41_n$, NAND circuit 51 and NOR circuit 52 is CMOS-structured, and operations thereof are controlled by p-channel MOS transistors $43_1$–$43_n$, 56, 57 having their gates connected in common to the p-channel MOS transistor 21 and n-channel MOS transistors $44_1$–$44_n$, 58, 59. Accordingly, when a current value changes due to a variation in resistance value, gate voltages of these control transistors vary, with the result that an output of the refresh timer circuit also changes.

FIG. 2 is a schematic sectional view illustrating a structure of the current bias circuit 20. An n-well 12 and a p-well 13 are provided on a silicon semiconductor substrate 11 so as to interpose a cell separation film 14 therebetween. These wells 12, 13 are formed with the p-channel MOS transistor 21 and the n-channel MOS transistor 31, respectively. $p^+$ diffused layers 22, 23 serving as a source and a drain are formed on the surface of the n-well 12, wherein a channel area is interposed therebetween. A gate electrode 25 is formed on the channel area with a gate insulating film 24 being sandwiched therebetween. Further, $n^+$ diffused layers 32, 33 are formed on the surface of the p-well 13, wherein a channel area is interposed therebetween. A gate electrode 35 is formed on the channel area with a gate insulating film 34 being sandwiched therebetween. These gate electrodes 25, 35 are formed of polycrystalline silicon into which phosphorus (P) is ion-implanted.

Also, the resistance element R11 is formed by layering the polycrystalline silicon undergoing no ion implantation in areas different from the gate electrodes 25, 35 of the transistors 21, 31. One side of this resistance element R11 is connected via a line of aluminum wiring 30 to the gate electrode 25 of the p-channel MOS transistor. 21 and the source or drain 23 thereof. The other side of the resistance element R11 is connected to the gate electrode 35 of the n-channel MOS transistor 31 and the source or drain 32 thereof. Further, the other source or drain 22 of the p-channel MOS transistor 21 is connected to the power supply Vcc, and the other source or drain 33 of the n-channel MOS transistor 31 is grounded.

Moreover, the resistance element R11 is formed of the polycrystalline silicon which is not subjected to the ion implantation but is a high resistance element having a larger temperature coefficient. This high resistance element exhibits a resistance value variation on the order of substantially one or two digits (10 times–100 times) between 0° C. and 100° C.

A refresh cycle Ca of the thus constructed current mirror type refresh timer circuit 10 exhibits such a characteristic that the cycle is shortened with an increase in the temperature T as indicted by the solid line in FIG. 3. It is because the current in the current bias circuit 20 changes due to a variation in the resistance value of the resistance element, and therefore, an oscillation frequency of the ring counter 40 changes. Incidentally, a difference on the order of substantially two digits is produced in the refresh cycle Ca in a temperature range of 0° C. to 80° C. Further, FIG. 3 illustrates an electric charge holding time X indicated by the broken line. In a comparison therebetween, the variation in the refresh cycle Ca is substantially the same as a relationship between the temperature T of the dynamic memory element constructed, as in the same way with the explanation in the prior art, of one capacitor and one transistor and the electric charge holding time X of the capacitor; and the refresh cycle is shorter than the electric charge holding time X at the same temperature.

Accordingly, the current mirror type refresh timer circuit 10 performs a refresh operation of the unillustrated dynamic memory element formed on the same silicon semiconductor substrate 11. The refresh operation of this dynamic memory element is, when the memory operation is effected at the temperature Ta1 within a temperature range defined as an operation assurance range, conducted at a refresh cycle Ca1 shorter than an electric charge holding time Xa1 of the capacitor at a temperature Ta1 at that time. Then, when an operating atmosphere changes to a temperature Ta2, the electric charge holding time of the dynamic memory element correspondingly changes to Xa2, and, at the same time, the refresh cycle also changes to Ca2 shorter than the electric charge holding time Xa2.

As discussed above, in accordance with this embodiment, the refresh cycle Ca of the current mirror type refresh timer circuit 10 always changes corresponding to variations in the operating atmosphere temperature T. Then, the refresh operation of the dynamic memory element is executed in the electric charge holding time, and, hence, a frequency of the refresh operation becomes adequate at each temperature within the operation assurance range, with the result that an extra current does not flow. Hence, the power supply for the refresh operation is not required to have a large capacity at all times, but the one having a proper capacity conforming with operating conditions may be selected.

Also when the power supply involves the use of a battery cell, this is not required to be large in size enough to have a large battery capacity; or a frequency of charging or replacing the battery may be small.

Furthermore, there is no necessity in which the semiconductor memory device is constructed to narrow the operating temperature range in conformity with the operating conditions, but the specifications of the semiconductor memory device can be generalized for use.

Note that the resistance element R11 is formed of the polycrystalline silicon undergoing no ion implantation but may be formed of the polycrystalline silicon into which ions are implanted with a low density, and the variations in the resistance value versus the temperature may be caused with substantially the same tendency as the variations in the electric charge holding time of the capacitor of the dynamic memory element.

Figure 4:
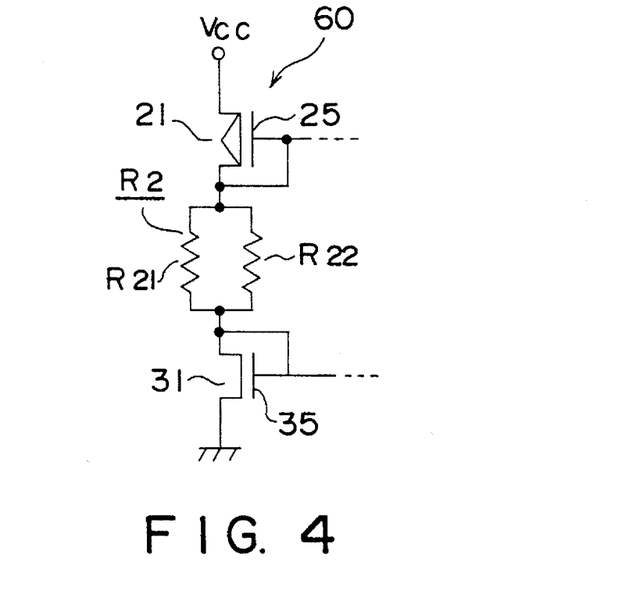
FIG. 4 is a circuit diagram illustrating a current bias circuit of the current mirror type refresh timer circuit in a second embodiment of the present invention.
Figure 5:
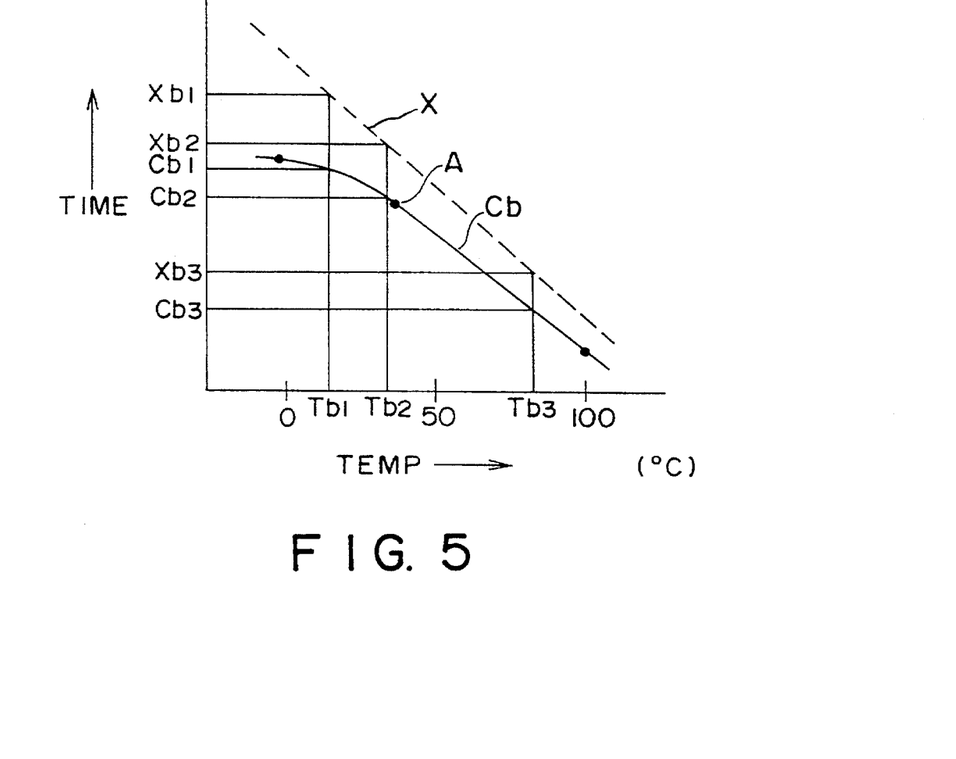
FIG. 5 is a characteristic diagram showing a temperature characteristic of the refresh cycle of the current mirror type refresh timer circuit versus the electric charge holding time of the dynamic memory element in the second embodiment of the present invention.

Next, a second embodiment will be described with reference to FIGS. 4 and 5. FIG. 4 is a circuit diagram illustrating a current bias circuit of the current mirror type refresh timer circuit. FIG. 5 is a temperature characteristic diagram showing a refresh cycle versus an electric charge holding time of the dynamic memory element.

FIG. 4 illustrates a current bias circuit 60 of the current mirror type refresh timer circuit constructed the same as the first embodiment. In this current bias circuit 60, a resistance component R2 is connected between source and drain areas of each of the p-channel MOS transistor 21 and the n-channel MOS transistor 31. This resistance component R2 is composed of resistance elements R21, R22 connected in parallel.

These resistance elements R21, R22 are formed in areas different from the gate electrodes of the transistors 21, 31. The resistance element R21 is formed by layering the polycrystalline silicon undergoing no ion implantation, but the resistance element R22 is formed of the polycrystalline silicon into which the phosphorus (P) is ion-implanted with a predetermined density. The resistance component R2 composed of the resistance elements R21, R22 thereby exhibits a resistance value variation of one or more digits (10 times or greater) between 0° C. and 100° C., wherein the variation in the resistance value with respect to the variation in the temperature is smaller on a lower temperature side including normal temperatures of 20° C. through 40 ° C. than on a high temperature side.

For this reason, a refresh cycle Cb of the current mirror type refresh timer circuit 10 including the resistance component R2 becomes as indicated by the solid line in FIG. 5. That is, the refresh cycle Cb is determined by the resistance value of the resistance element R22 composed of the ion-implanted polycrystalline silicon on the low temperature side inclusive of the normal temperatures of 20° C. to 40° C., and the variation with respect to the variation in the temperature is small. Whereas on the high temperature side, the refresh cycle Cb is determined by the resistance value of the resistance element R21 undergoing no implantation, and the cycle becomes shorter with a higher temperature T. Incidentally, a difference on the order of substantially one digit can be seen in the refresh cycle Cb in the temperature range of 0° C. through 80° C.

Then, this refresh cycle Cb is shorter than the electric charge holding time X at the same temperature T of the same dynamic: memory element as that explained in the prior art, and the refresh operation of the dynamic memory element is performed in the electric charge holding time. Note that a point A in FIG. 5 shows a point at which the resistance value of the resistance element R21 is equal to that of the resistance element R22. A position of the point A can be shifted by properly setting the resistance values of the resistance elements R21, R22. Further, the electric charge holding time X is shown by the broken line in FIG. 5.

In accordance with this embodiment, the current mirror type refresh timer circuit having the thus constructed current bias circuit 60 performs the refresh operation of the dynamic memory element formed on the same silicon semiconductor substrate as this. The refresh operation of this dynamic memory element is, when the memory operation is effected at temperatures Tb1, Tb2 on a low temperature side of the operation assurance range, conducted at refresh cycles Cb1, Cb2 shorter than electric charge holding times Xb1, Xb2 of the capacitor. Also, a difference between the two refresh cycles Cb1 and Cb2 is small.

Further, even when at a temperature Tb3 higher than the above-mentioned, the refresh operation is carried out at a refresh cycle Cb3 shorter than an electric charge holding time Xb3 of the capacitor. On the high temperature side, however, a variation in the refresh cycle Cb with respect to the variation in the temperature is larger than on the low temperature side.

Accordingly, in this embodiment, the variation in the refresh cycle Cb decreases in such a temperature area that a using frequency is high, e.g., at the normal temperatures of 20° C. through 40° C. It is possible to stabilize the current consumed by the refresh operation, and, at the same time, the same action and effects as those in the first embodiment can be obtained.

Figure 6:
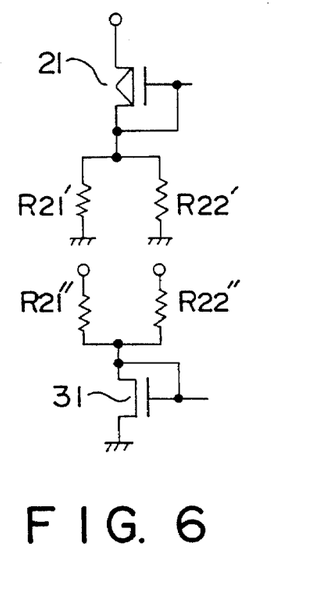
FIG. 6 is a circuit diagram illustrating a first example of modification of the embodiment shown in FIG. 4.
Figure 7:
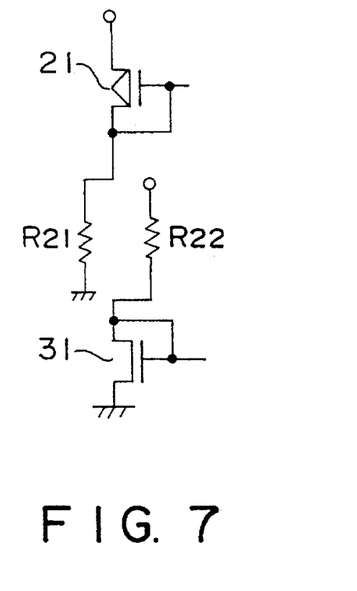
FIG. 7 is a circuit diagram showing a second example of modification of the embodiment shown in FIG. 4.

FIGS. 6 and 7 illustrate examples of modification of the embodiment shown in FIG. 4.

Referring to FIG. 6, the resistance element R21 is divided into resistance subelements R21', R21". The resistance subelement R21' is grounded, while the resistance subelement R21" is connected to the power supply. The resistance element R22 is divided into resistance subelements R22', R22". The resistance subelement R22' is grounded, while the resistance subelement R22" is connected to the power supply.

Referring further to FIG. 7, the resistance element R21 of the two resistance elements is grounded, while the resistance element R22 is connected to the power supply.

The operation can be performed at a still lower voltage by effecting such divisions.

Figure 8:
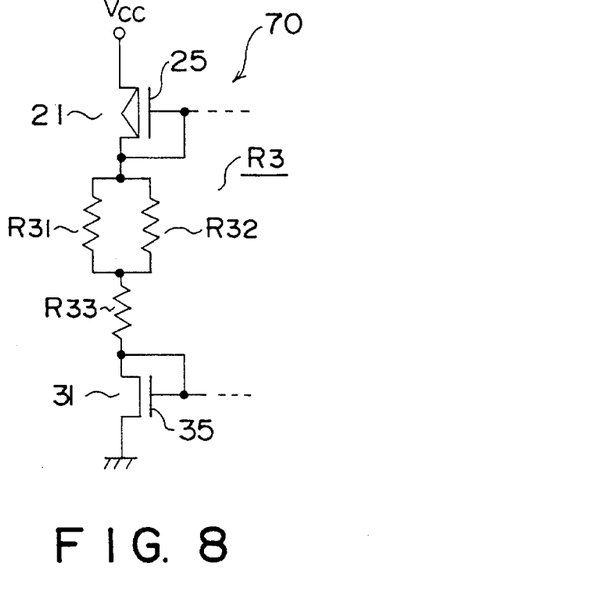
FIG. 8 is a circuit diagram illustrating a current bias circuit of the current mirror type refresh timer circuit in a third embodiment of the present invention.
Figure 9:
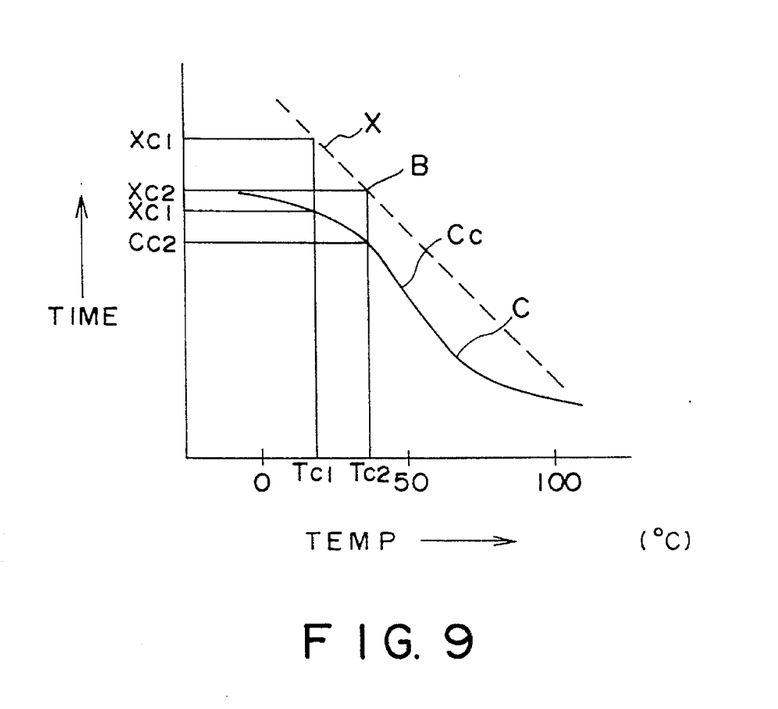
FIG. 9 is a characteristic diagram showing a temperature characteristic of the refresh cycle of the current mirror type refresh timer circuit versus the electric charge holding time of the dynamic memory element in the third embodiment of the present invention.

Next, a third embodiment will be discussed with reference to FIGS. 8 and 9. FIG. 8 is a circuit diagram illustrating a current bias circuit 70 of the current mirror type refresh timer circuit. FIG. 9 is a characteristic diagram showing a temperature characteristic of a refresh cycle versus an electric charge holding time of the dynamic memory element.

In the current bias circuit 70, shown in FIG. 8, of the current mirror type refresh timer circuit constructed the same as the one in the first embodiment, a resistance component R3 is connected between source and drain areas of the p-channel MOS transistor 21 and the n-channel MOS transistor 31. The resistance component R3 is composed of a resistance element R31 connected in parallel, a resistance element R32 and a resistance element R33 connected in series to these resistance elements R31, R33.

These resistance elements R31, R32, R33 are formed by layering the polycrystalline silicon into which the ions are not implanted in areas different from the gate electrodes 25, 35 of the transistors 21, 31. The resistance elements R32, R33 are formed of the polycrystalline silicon into which the phosphorus (P) is ion-implanted with a predetermined density. The resistance component R3 composed of the resistance elements R31, R32 exhibits a resistance value variation of one or more digits (100 times or greater) between 0° C. and 100° C., wherein the variation in the resistance value with respect to the variation in the temperature on the high temperature side showing a relatively high value as well as on the low temperature side including the normal temperatures of 20° C. through 40° C. is smaller than in an intermediate temperature area therebetween.

For this reason, a refresh cycle Cc of the current mirror type refresh timer circuit having the resistance component R3 becomes as indicated by the solid line in FIG. 7. More specifically, on the low temperature side including the normal temperatures of 20° C. through 40° C. lower than a temperature at a point B, the refresh cycle Cs is determined by the resistance elements R31, R32 and exhibits a small variation with respect to the variation in the temperature. Further, on the higher temperature side than a temperature at a point C, the refresh cycle Cc is determined by the resistance element R33 and, similarly, exhibits the small variation with respect to the variation in the temperature. Furthermore, in the intermediate temperature area between the point B and the point C, the refresh cycle Cc becomes shorter with an increase in the temperature T. Incidentally, a difference on the order of substantially one digit can be seen in the refresh cycle Cc within the temperature range of 0° C. through 80° C.

Then, this refresh cycle Cc is shorter than the electric charge holding time X at the same temperature T of the same dynamic memory element as the one explained in the prior art. The refresh operation of the dynamic memory element is conducted in the electric charge holding time. Note that FIG. 7 shows the electric charge holding time X indicated by the broken line.

The memory device in this embodiment is thus constructed, and, hence, the current mirror type refresh timer circuit including the current bias circuit 70 performs the refresh operation of the dynamic memory element formed on the same silicon semiconductor substrate as this. The refresh operation of this dynamic memory element is, when the memory operation is conducted at temperatures Tc1, Tc2 on the low temperature side within the operation assurance range, carried out at refresh cycles Cc1, Cc2 shorter than electric charge holding times Xc1, Xc2 of the capacitor. Further, a difference between the two refresh cycles Cc1 and Cc2 is small.

For this reason, in accordance with this embodiment, the variation in the refresh cycle Cc decreases in the temperature area having a high using frequency, e.g., at the normal temperatures of 20° C. to 40° C., and the same action and effects as those in the second embodiment are obtainable.

Figures 10, 11:
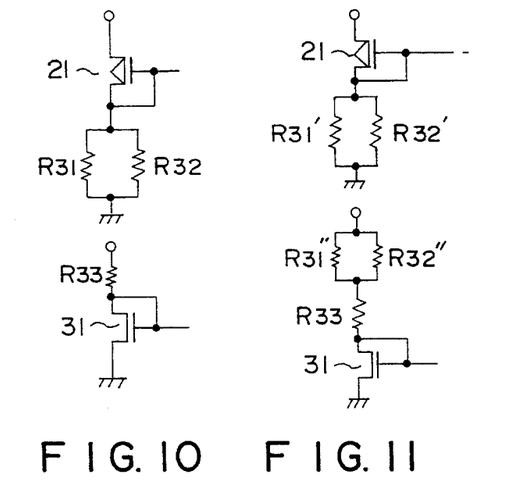
FIG. 10 is a circuit diagram illustrating a first example of modification of the embodiment shown in FIG. 8.
FIG. 11 is a circuit diagram showing a second example of modification of the embodiment shown in FIG. 8.

FIGS. 10 and 11 illustrate examples of modification of the embodiment shown in FIG. 8.

Referring to FIG. 10, the resistance elements R31, R32 connected in parallel are separated from the resistance element R33. The resistance elements R31, R32 connected in parallel are grounded in common, and the resistance element R33 is connected to the power supply. Referring further to FIG. 11, the resistance element R31 is divided into resistance subelements R31', R31A. The resistance element R32 is divided into resistance subelements R32', R32". Besides, the resistance subelements R31', R32' are grounded in common, and the resistance subelements R31", R32" are connected to the power supply in common.

The operation can be done at a still lower voltage by effecting such divisions.

The embodiments have presented some examples. The present invention is, however, not confined to only the embodiments discussed above but properly modifiable in the scope of the invention without departing from the gist thereof.

What is claimed is:

1. A semiconductor memory device comprising:

a dynamic memory element including a capacitor and a transistor;

a refresh timer circuit for recharging said dynamic memory element at periodic time intervals corresponding to an electric charge holding time of the dynamic memory element, which varies in accordance with ambient temperature, wherein the refresh timer circuit includes:

a current bias circuit for varying an electric current in accordance with changing ambient temperature, said current bias circuit having a resistance component constructed by connecting in parallel a first resistance element exhibiting a resistance value variation that is 10 times or above between 0° C. and 100° C. and a second resistance element exhibiting a resistance value variation that is 10 times or under between 0° C. and 100° C.; and an oscillation circuit for oscillating at a frequency corresponding to the electric current of the current bias circuit.

2. A semiconductor memory device according to claim 1, wherein the current bias circuit further includes a P channel transistor and an N channel transistor connected in series via the resistance component, whereby different electric currents flow through the P and N channel transistors due to the resistance value variations of the first and second resistance elements.

* * * * *